(12) United States Patent
Kim

(10) Patent No.: US 10,191,085 B2
(45) Date of Patent: Jan. 29, 2019

(54) WIRED RUBBER CONTACT AND METHOD OF MANUFACTURING THE SAME

(71) Applicants: Hyung Ik Kim, Chongju-shi, Chungcheongbuk-do (KR); WOWRO Co., Ltd, Chungcheongbuk-do (KR)

(72) Inventor: Hyung Ik Kim, Chongju (KR)

(73) Assignees: Hyung Ik Kim, Chongju-shi, Chungcheongbuk-Do (KR); WOWRO CO., LTD, Chongwon-Gun, Chungcheongbuk-Do (KR)

( * ) Notice: Subject to any disclaimer, the term of this patent is extended or adjusted under 35 U.S.C. 154(b) by 0 days.

(21) Appl. No.: 15/030,400

(22) PCT Filed: Feb. 26, 2015

(86) PCT No.: PCT/KR2015/001847
§ 371 (c)(1),
(2) Date: Apr. 19, 2016

(87) PCT Pub. No.: WO2015/130091
PCT Pub. Date: Sep. 3, 2015

(65) Prior Publication Data
US 2016/0356816 A1 Dec. 8, 2016

(30) Foreign Application Priority Data

Feb. 28, 2014 (KR) .................. 10-2014-0024272
Aug. 11, 2014 (KR) .................. 10-2014-0103269

(51) Int. Cl.
*G01R 3/00* (2006.01)
*G01R 1/067* (2006.01)
*G01R 1/073* (2006.01)

(52) U.S. Cl.
CPC ............ *G01R 3/00* (2013.01); *G01R 1/0735* (2013.01); *G01R 1/07314* (2013.01)

(58) Field of Classification Search
None
See application file for complete search history.

(56) References Cited

U.S. PATENT DOCUMENTS 4,320,438 A 3/1982 Ibrahim et al.
4,423,401 A 12/1983 Mueller
(Continued)

FOREIGN PATENT DOCUMENTS

CN 1336549 2/2002
CN 1662820 8/2005
(Continued)

OTHER PUBLICATIONS

Written Opinion with English Translation for International Application No. PCT/KR2015/001847, dated May 28, 2015.
(Continued)

*Primary Examiner* — Jermele M Hollington
*Assistant Examiner* — Suresh K Rajaputra
(74) *Attorney, Agent, or Firm* — Kile Park Reed & Houtteman PLLC

(57) ABSTRACT

A wired rubber contact including a lower film, an upper film, a plurality of conductive wires, a rubber layer, and a film guide. The lower film includes a plurality of lower electrode parts formed in openings. A periphery of the upper film is disposed within an interface between the central area and the peripheral area. The conductive wires are disposed between the lower film and the upper film, and connect between the lower electrode parts and the upper electrode parts. The rubber layer includes elastic material. A periphery of the rubber layer is protruded toward an outer side from the periphery of the upper film. The rubber layer maintains a constant distance between the lower film and the upper film.

(Continued)

The film guide is disposed in the peripheral area of the lower film along a side surface of the rubber layer and integrally formed with the lower film.

4 Claims, 11 Drawing Sheets

(56) References Cited

U.S. PATENT DOCUMENTS

| | | | |
|---|---|---|---|
| 5,121,298 A | 6/1992 | Sarma et al. | |
| 6,791,171 B2* | 9/2004 | Mok | G01R 1/06711 |
| | | | 257/678 |
| 6,799,976 B1* | 10/2004 | Mok | G01R 1/07371 |
| | | | 439/55 |
| 2003/0099097 A1* | 5/2003 | Mok | G01R 1/06716 |
| | | | 361/767 |

FOREIGN PATENT DOCUMENTS

| | | |
|---|---|---|
| JP | 9-35789 | 2/1997 |
| JP | 10-270624 | 10/1998 |
| JP | 2001-223240 | 8/2001 |
| JP | 2005-209606 | 8/2005 |
| KR | 10-2014-0021229 | 2/2014 |

OTHER PUBLICATIONS

International Search Report for International Application No. PCT/KR2015/001847, dated May 28, 2015.

* cited by examiner

WIRED RUBBER CONTACT AND METHOD OF MANUFACTURING THE SAME

TECHNICAL FIELD

The present invention relates to a wired rubber contact and a method of manufacturing the same, and more particularly, to a wired contact rubber having increased lifetime and reliability and a method of manufacturing the same.

BACKGROUND ART

In semiconductor manufacturing processes, inspection process is directly related to reliability of a product and is very important. A semiconductor requires inspections after completion of packaging as well as steps before the packaging.

In order to inspect electric characteristics of the semiconductor before or after the packaging, an electric power is applied to a pad of the semiconductor. Applying the electric power to the pad of the semiconductor having a highly integrated circuit is nearly impossible, so that a pad having anisotropic characteristics is interposed between the semiconductor and a test stage. The electric power applied to the test stage passes through the anisotropic pad to be applied to the semiconductor, thereby performing test.

In a conventional anisotropic pad, an insulating silicon rubber is interposed between electrodes and silicon resin in which conductive particles are uniformly scattered is solidified in the electrodes, so that the electrodes form a structure in an electrically conductive state.

In the above-structure, scattering state in each of the electrodes is different so that reliability of the product is not uniform through the products, and when the electrode is pressed more than or equal to 30%, the conductive particles tear the silicon to be drifted, and thus, deterioration of product quality and decrease of lifetime may be caused.

Also, when a height of the silicon is increased, the quality is greatly decreased. In contrast, when a pitch of the electrode is decreased, the lifetime of the product is decreased and electric characteristics is deteriorated.

As another technology of anisotropic pad, a technology of implanting a wire in a silicon rubber has been studied. However, when the sire is implanted into the wire, during repeating of the test, the wire and the pad are buried in the rubber.

DISCLOSURE

Technical Problem

In order to solve the above-mentioned problems, the present invention is directed to a wired contact rubber having increased lifetime and reliability.

The present invention is also directed to a method of manufacturing the wired rubber contact.

Technical Solution

One aspect of the present invention provides a wired rubber contact including a lower film, an upper film, a plurality of conductive wires, a rubber layer, and a film guide. The lower film has a central area in which a plurality of openings are formed and a peripheral area surrounding the central area, and includes a plurality of lower electrode parts formed in the openings. The upper film includes a plurality of openings and a plurality of upper electrode parts formed in the openings. A periphery of the upper film is disposed within an interface between the central area and the peripheral area. The conductive wires are disposed between the lower film and the upper film, and connect between the lower electrode parts and the upper electrode parts. The rubber layer includes elastic material and disposed in the central area of the lower film. A periphery of the rubber layer is protruded toward an outer side from the periphery of the upper film. The rubber layer buries the conductive wires and maintains a constant distance between the lower film and the upper film. The film guide is disposed in the peripheral area of the lower film along a side surface of the rubber layer and integrally formed with the lower film. The film guide has a thickness greater than the lower film.

The upper film and the lower film may be integrally formed with the rubber layer.

Another aspect of the present invention provides a method of manufacturing a wired rubber contact. A lower electrode part passing through each of openings of a lower film is formed. The lower film includes a central area in which the openings are formed and a peripheral area surrounding the central area. A supporting plate in the peripheral area is attached. The supporting plate prevents the lower film from drifting. A center of the supporting plate is opened to expose the central area. Conductive wires are combined on the lower electrode part. The conductive wires are arranged in a vertical direction. A mold is formed on the supporting plate. The mold surrounds the central area. A primitive upper film is disposed on the conductive wire and the mold to combining upper end portions of the conductive wires to the upper electrode parts. The primitive upper film includes a plurality of openings and a plurality of upper electrode parts formed in the openings. A rubber layer is formed in an internal space defined by the lower film, the mold, and the primitive upper film. The primitive upper film is cut along a cutting line disposed within an interface between the central area and the peripheral area of the lower film to form an upper film. A periphery of the upper film is disposed within a periphery of the rubber layer. The mold and the supporting plate are removed. A film guide is attached onto the peripheral area of the lower film.

The film guide may be attached by integrally forming the film guide with the lower film.

Still another aspect of the present invention provides a wired rubber contact including a lower film, an upper film, a plurality of conductive wires, a rubber layer, a film guide, and a combining member. The lower film includes a plurality of openings and a plurality of lower electrode parts formed in the openings. The upper film includes a plurality of openings and a plurality of upper electrode parts formed in the openings and faces the lower electrode parts. The conductive wires are disposed between the lower film and the upper film and connect between the lower electrode parts and the upper electrode parts. A length of the conductive wires are greater than an interval between the lower film and the upper film. The rubber layer includes elastic material and is disposed between the lower film and the upper film to bury the conductive wires. The rubber layer maintains a constant distance between the lower film and the upper film. The film guide is disposed to surround side surfaces of the rubber layer and the lower film. The film guide has a thickness greater than the lower film. The combining member includes elastic adhesive and is attached to a side surface of the rubber layer and an upper surface of the film guide to combine the rubber layer with the film guide.

The combining member may include an adhesive member or a combining fixture.

Further still another aspect of the present invention provides a method of manufacturing a wired rubber contact. A primitive lower film and a primitive upper film are parallelly aligned. The primitive lower film has a central area in which a plurality of openings are formed and a peripheral area surrounding the central area. The primitive lower film includes a plurality of lower electrode parts formed in the openings. The primitive upper film includes a plurality of openings and a plurality of upper electrode parts formed in the openings. The lower electrode parts are connected to the upper electrode parts through conductive wires. Silicon rubber is injected and solidified between the primitive upper film and the primitive lower film. The primitive upper film, the solidified silicon rubber, and the primitive lower film are cut along an interface between the central area and the peripheral are to form an upper film, a rubber layer, and a lower film. A sticky tape is attached to cover an entire of a lower surface of a film guide. The film guide has a central opening. The central opening has a size equal to or greater than the central area. A lower surface of the lower film is attached to the sticky tape exposed through the central opening. The rubber layer is combined with the film guide. The sticky tape is removed.

The lower electrode part and the upper electrode part may be connected by the conductive wires by transporting the lower film and the upper film along two conveyors, and sequentially connecting the lower electrode parts to the upper electrode parts by the conductive wires as the lower film and the upper film being transported. The conveyors may be arranged to face each other. An interval of upper portions of the conveyors may be greater than an interval of lower portions thereof and The lower electrode parts may fill the openings of the primitive lower film. The upper electrode parts may be formed along a periphery of the openings of the primitive upper film to form throughholes in a center thereof. The lower electrode part and the upper electrode part may be connected by the conductive wires by arranging the primitive upper film and the primitive lower film so that the lower electrode part is exposed through the throughholes of the upper electrode part, connecting one end portions of the conductive wires to upper surfaces of the lower electrode parts, connecting another end portions of the conductive wires to upper surfaces or inner surfaces of the upper electrode parts, and separating a distance between the primitive upper film from the primitive lower film so that the conductive wires are interposed between the primitive upper film and the primitive lower film.

The connecting the lower electrode parts and the upper electrode parts by the conductive wires may further include soldering the upper electrode parts to fill the throughholes.

Advantageous Effects

In order to solve the above problems, according to the present invention, a lower electrode part and an upper electrode part of an electro-connecting member are securely combined with a lower film and an upper film, thereby preventing defect in which the lower electrode part or the upper electrode part is buried into a rubber layer.

Also, a peripheral area corresponding to a periphery of the lower film is extended toward an outer side of a rubber layer and a film guide is combined with the lower film in the peripheral area, so that the wired rubber contact may be easily disposed or fixed on a stage. Furthermore, the film guide is disposed adjacent to the rubber layer to dissipate an external force, thereby preventing concentration of the external force on an interface between the lower film and the rubber layer. Thus, separation of the lower film from the rubber layer is prevented.

Also, a gap is formed between the periphery of the upper film and a periphery of a central area of the lower film, so that separation of the upper film from the rubber layer by the external force is prevented, and thus, electrical connection of the electro-connecting member is secured.

Furthermore, the upper film and the lower film cover upper and lower surfaces of the rubber layer to protect the rubber layer and the electro-connecting member from external pollutants such as dust, moisture, etc.

Also, the upper film is pressed so that a lower surface of the lower film is attached to a sticky tape, and a lower portion of the lower electrode part is disposed under a lower surface of the film guide. When the lower portion of the lower electrode part is disposed under the lower surface of the film guide, the lower electrode part may easily make contact with an electrode pad of the stage after the sticky tape is removed.

Furthermore, an elastic member and the film guide cover side surfaces of the rubber layer, the lower film, and the upper film, so that separation of the lower film or the upper film from the rubber layer by the external impact is prevented.

Also, an adhesive member has elasticity, so that the external impact is not transmitted to the electro-connecting member.

Furthermore, conductive wires may be continuously attached through a conveyor, thereby decreasing manufacturing time.

Also, a length of the conductive wire is greater than a distance between a primitive lower film and a primitive upper film and a distance between the lower film and the upper film, so that disconnection of the conductive wire by the external impact during a manufacturing process is prevented.

Furthermore, the conductive wire and a mold are interposed between the primitive upper film and the primitive lower film through a continuous process, thereby decreasing the manufacturing time.

Also, the rubber layer is only formed in an inner space formed using the mold, a process of cutting the solidified silicon rubber is omitted, thereby decreasing defect generated during a cutting process.

Furthermore, the upper electrode part and the lower electrode part have different structures from each other, and simultaneously, a plurality of the conductive wires may be coupled to the upper electrode part and the lower electrode part.

Therefore, a lifetime is increased, and reliability is improved.

DESCRIPTION OF DRAWINGS

FIGS. 5, 8, 10, 13, and 14 are plan views illustrating the method of manufacturing the wired rubber contact shown in FIG. 1.

BEST MODE OF THE INVENTION

Figure 1:
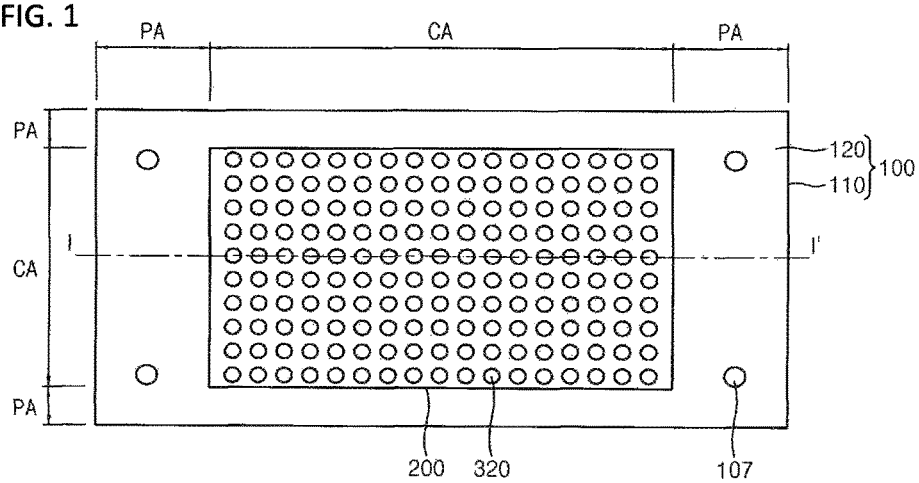
FIG. 1 is a plan view illustrating a wired rubber contact according to one embodiment of the present invention.

Various example embodiments will be described more fully hereinafter with reference to the accompanying drawings, in which some example embodiments are shown, and embodiments of the present invention can be embodied in various forms and should not be limited by the embodiments explained in the specification.

The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, with reference to the accompanying drawings, the preferable embodiments of the present invention will be explained. Same elements of the drawings are represented by the same reference numerals, and repetitive explanation concerning the same elements will be omitted.

Figure 2:
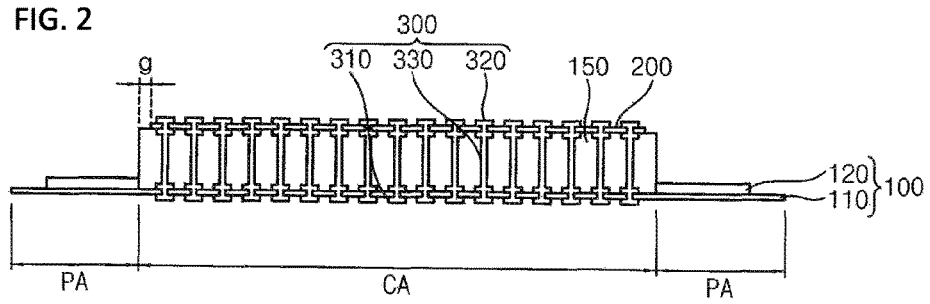
FIG. 2 is a cross-sectional view taken along a line I-I' of FIG. 1.

FIG. 1 is a plan view illustrating a wired rubber contact according to one embodiment of the present invention, and FIG. 2 is a cross-sectional view taken along a line I-I' of FIG. 1.

Referring to FIGS. 1 and 2, the wired rubber contact includes a film assembly 100, a rubber layer 150, an upper film 200, and an electro-connecting member 300.

The film assembly 100 includes a lower film 110 and a film guide 120.

The lower film 110 includes a thin synthetic resin film. For example, the lower film 110 may have a thickness of 100 µm to 250 µm. In the present invention, the lower film 110 may include a synthetic resin such as polyimide, polyvinyl, polypropylene, polycarbonate, FR4, PVC, etc.

The lower film 110 includes a central area CA and a peripheral area PA surrounding the central area CA. The lower film 110 includes a plurality of openings, and lower electrode parts 310 are respectively disposed in the openings through the lower film 110. That is, an upper portion of each of the lower electrode part 310 is protruded from an upper surface of the lower film 110 in an upper direction, and a lower portion of each of the lower electrode parts 310 is protruded from a lower surface of the lower film 110 in a lower direction.

The film guide 120 has a plane shape and is integrally formed on the lower film 110 to guide the lower film 110, so that the lower film 110 has a plane shape. The film guide 120 is disposed in the peripheral area PA of the lower film 110. In the present invention, the film guide 120 may include a synthetic resin such as polyimide, polyvinyl, polypropylene, polycarbonate, FR4, PVC, etc. For example, the film guide 120 may have a thickness of 500 µm to 1 mm.

The upper film 200 includes a thin synthetic resin film. For example, the upper film 200 may have a thickness of 100 µm to 250 µm. In the present invention, the upper film 200 may include a synthetic resin such as polyimide, polyvinyl, polypropylene, polycarbonate, FR4, PVC, etc. For example, the upper film 200 may have the same material as the lower film 110.

The upper film 200 is disposed on the lower film 110 to face each other, and corresponds to the central area CA of the lower film 110.

The upper film 200 includes a plurality of openings corresponding to the openings of the lower film 110, and upper electrode parts 320 are respectively disposed in the openings through the upper film 200. That is, an upper portion of each of the upper electrode part 320 is protruded from an upper surface of the upper film 200 in the upper direction, and a lower portion of each of the upper electrode parts 320 is protruded from a lower surface of the upper film 200 in the lower direction.

The rubber layer 150 is disposed between the central area CA of the lower film 110 and the upper film 200, and constantly maintains an interface between the lower film 110 and the upper film 200.

The rubber layer 150 may include an elastic material, for example, silicon resin, synthetic rubber, etc. When an external force is applied onto the upper film 200, the rubber layer 150 shrinks to resist the external force. Also, although a semiconductor chip 20 (shown in FIG. 3) having an irregular shape is disposed on the upper film 200, secure electric connection may be formed by the shrinkage of the rubber layer 150. In another embodiment, the conductive wire 330 itself may have enough strength and elasticity, so that the rubber layer 150 may be omitted.

In the present embodiment, a gap 'g' is formed between a periphery of the upper film 200 and a periphery of the central area CA of the lower film 110. The periphery of the rubber layer 150 is protruded from the periphery of the upper film 200 by the gap 'g' through the gap 'g'. When the periphery of the rubber layer 150 is not protruded from the periphery of the upper film 200, an edge of the upper film 200 may be disposed on a corner of the rubber layer 150 or protruded from the rubber layer 150. When the periphery of the upper film 200 is disposed on the corner of the rubber 150 or protruded from the rubber layer 150, the upper film 200 may be separated and lifted from the rubber layer 150 by the external force. When the upper film 200 is separated and lifted from the rubber 150, an impact may be applied to the upper electrode part 320 so that connection of the upper electrode part 320 may be poor or the conductive wire 330 connected to the upper electrode part 320 may be disconnected. However, as described in the present embodiment, when the periphery of the rubber layer 150 is protruded from the periphery of the upper film 200 by the gap 'g', separation of the upper film 200 from the rubber layer 150 is prevented and electric connection of the electro-connecting member is secured.

The electro-connecting member 300 includes the lower electrode part 310, the upper electrode part 320, and the conductive wire 330.

The lower electrode part 310 is formed through each of the openings of the lower film 110. In the present embodiment, the lower electrode part 310 may be formed through soldering. For example, liquid solder paste is soldered on a screen printed film (for example, a blind via type film) using heat or laser to form the lower electrode part 310. The soldering may include tin, lead, gold, silver alloy, copper, aluminum, nickel, rhodium, an alloy thereof, etc. For example, widths of an upper portion and a lower portion of the lower electrode part 310 are greater than a diameter of each of the openings of the lower film 110, so that the lower electrode part 310 may be securely combined with the lower film 110.

The upper electrode part 320 is formed through each of the openings of the upper film 200. In the present embodiment, the upper electrode part 330 may be formed through soldering. For example, liquid solder paste is soldered on a screen printed film (for example, a blind via type film) using heat or laser to form the upper electrode part 320. The soldering may include tin, lead, gold, silver alloy, copper, aluminum, nickel, rhodium, an alloy thereof, etc. For example, widths of an upper portion and a lower portion of the upper electrode part 320 are greater than a diameter of each of the openings of the upper film 200, so that the upper electrode part 320 may be securely combined with the upper film 200.

The conductive wire 330 electrically connects the lower electrode part 310 to the upper electrode part 320 through the rubber layer 150. For example, the conductive wire 330 may include tin, lead, gold, silver alloy, copper, aluminum, nickel, rhodium, an alloy thereof, etc. In another embodiment, the conductive wire 330 may include an inner conductive layer (not shown) and an outer elastic layer (not shown) coating the inner conductive layer (not shown). For example, the inner conductive layer (not shown) may include a gold wire, and the outer elastic layer (not shown) may include a nickel layer plated on a surface of the inner conductive layer (not shown).

Figure 3:
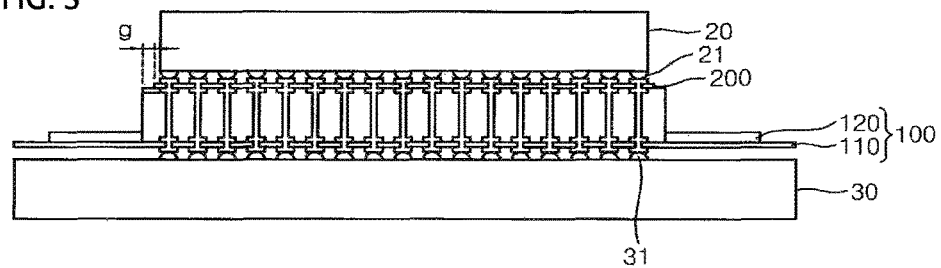
FIG. 3 is a cross-sectional view illustrating a the rubber contact shown in FIG. 1 interposed between a semiconductor chip and a stage.

FIG. 3 is a cross-sectional view illustrating the rubber contact shown in FIG. 1 interposed between a semiconductor chip and a stage.

Referring to FIGS. 1 to 3, a semiconductor chip 20 is disposed on the upper film 200. Electrode pads 21 of the semiconductor chip 20 make contact with the upper electrode part 320 exposed on the upper film 200.

The stage 30 is disposed under the film assembly 100. For example, the stage 30 may include an inspection stage for the semiconductor chip 20. The lower electrode part 310 exposed under the lower film 110 makes contact electrode pads 31 of the stage 30.

FIGS. 4, 6, 7, 9, 11, 12, 14, 15 to 17 are cross-sectional views illustrating a method of the wired rubber contact shown in FIG. 1, and FIGS. 5, 8, and 14 are plan views illustrating the method of manufacturing the wired rubber contact shown in FIG. 1.

Figure 4:
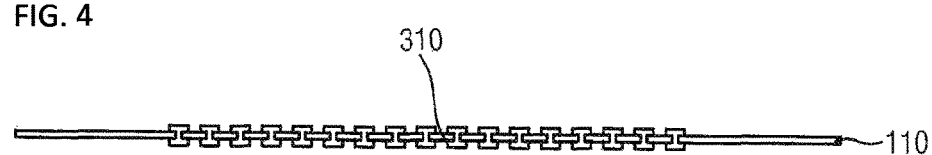
FIGS. 4, 6, 7, 9, 11, 12, 14, 15 to 17 are cross-sectional views illustrating a method of the wired rubber contact shown in FIG. 1.

FIG. 4 is a cross-sectional view illustrating the lower electrode parts formed on the lower film.

Referring to FIG. 4, firstly, the openings are formed in the central area CA (shown in FIG. 2) of the lower film 110. Then, a solder paste is printed in the openings of the lower film 110. Then, heat or laser is irradiated on the printed solder paste to form the lower electrode part 310.

Figure 5:
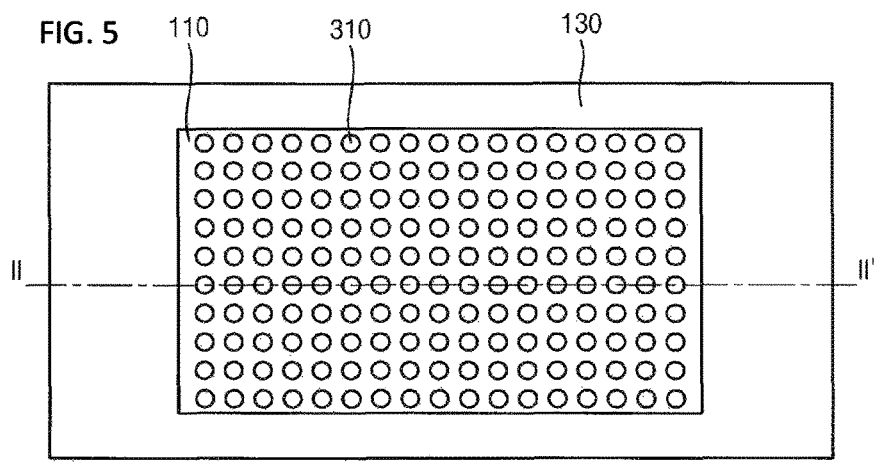
Figure 6:
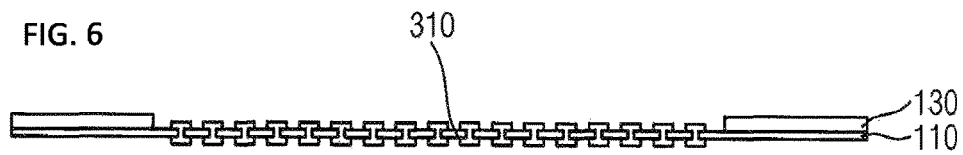

FIG. 5 is a plan view illustrating a supporting plate disposed on the lower film shown in FIG. 4, and FIG. 6 is a cross-sectional view illustrating a line II-II' of FIG. 5.

Referring to FIGS. 5 and 6, the supporting plate 130 is attached in the peripheral area PA (shown in FIG. 2) of the lower film 110 in which the lower electrode part 310 is formed. A center of the supporting plate 130 is opened to expose the central area CA (shown in FIG. 2) of the lower film 110.

Figure 7:
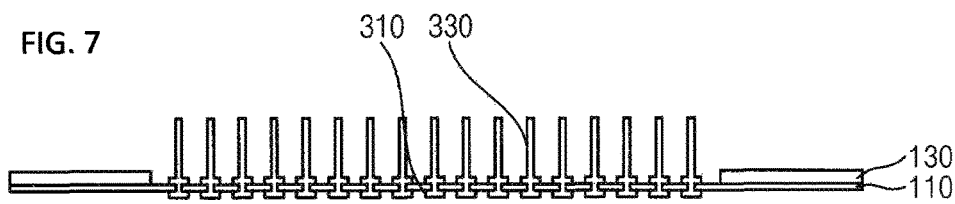

FIG. 7 is a cross-sectional view illustrating the conductive wire formed on the lower electrode part shown in FIGS. 5 and 6.

Referring to FIG. 7, the conductive wire 330 is soldered on the lower electrode part 310. For example, an end portion of the conductive wire 330 is inserted in the lower film 110 on which the solder paste is printed, and then, the heat or the laser is irradiated on the solder paste to form the lower electrode part 310 and the conductive wire 330.

Figure 8:
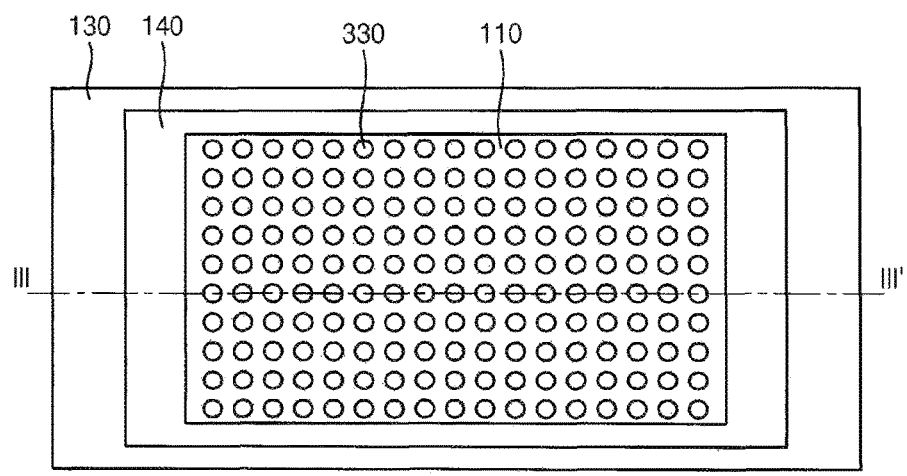
Figure 9:
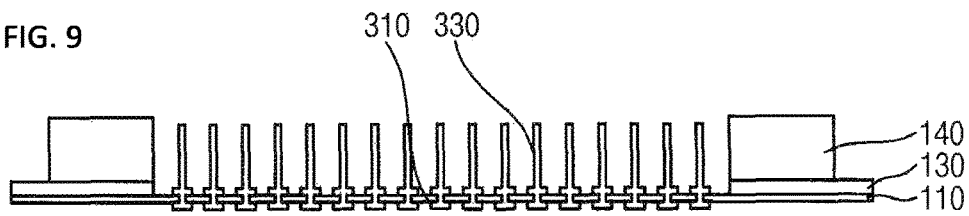

FIG. 8 is a plan view illustrating a mold formed on the supporting plate shown in FIG. 7, and FIG. 9 is a cross-sectional view taken along a line III-III' of FIG. 8.

Referring to FIGS. 8 and 9, the mold 140 surrounding the central area CA (shown in FIG. 2) is formed on the supporting plate 130. For example, the mold 140 is disposed in the peripheral area PA (shown in FIG. 2) adjacent to the central area CA (shown in FIG. 2) to surround the central area CA (shown in FIG. 2).

In another embodiment, a portion of the mold 140 may be opened to form an inlet (not shown) of a silicon rubber (not shown).

Figure 10:
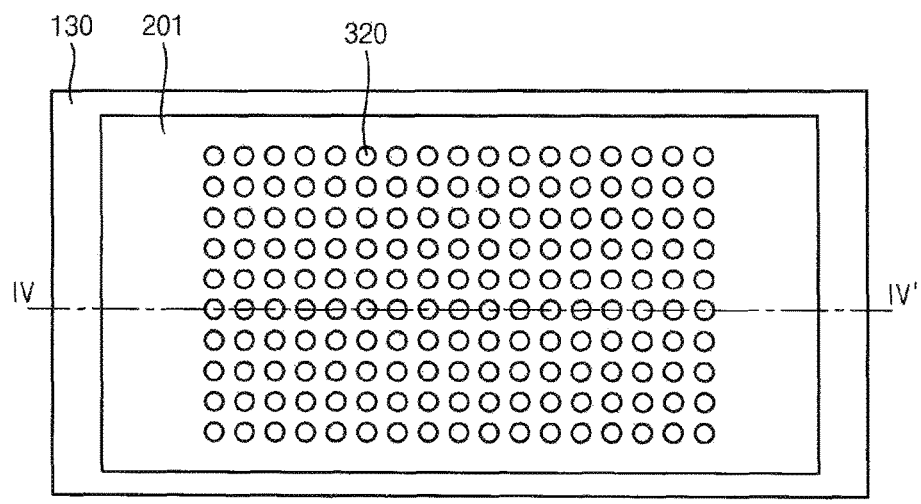
Figure 11:
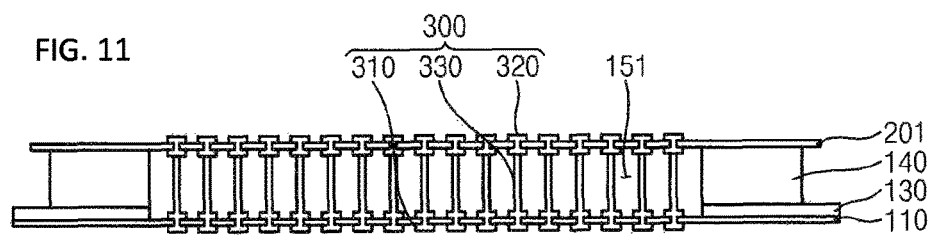

FIG. 10 is a plan view illustrating a primitive upper film disposed on the mold shown in FIGS. 8 and 9, and FIG. 11 is a cross-sectional view taken along a line IV-IV' of FIG. 10.

Referring to FIGS. 10 and 11, the primitive upper film 201 is then disposed on the mold 140 so that the conductive wire 330 is connected to the upper electrode part 320.

For example, a plurality of openings are formed in a central area of the primitive upper film 201, and a solder paste is printed in each of the openings. Then, the primitive upper film 201 is disposed on the mold 140, and the upper portion of the conductive wire 330 is inserted into the solder paste. Then heat or laser is irradiated onto the solder paste to form the upper electrode part 320 soldered on the conductive wire 330 is formed.

The primitive upper film 201, the lower film 110, the mold 140, and the supporting plate 130 define an inner space 151, and the conductive wire 330 is disposed in the inner space 151.

Figure 12:
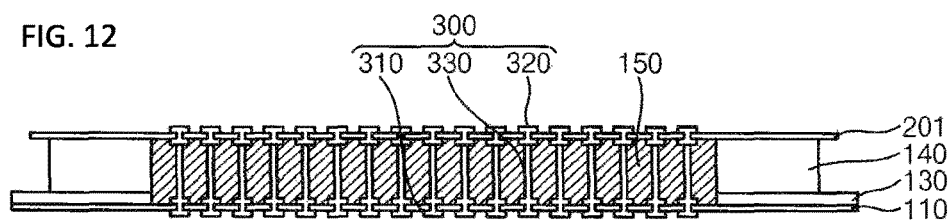

FIG. 12 is a cross-sectional view illustrating a rubber layer formed in the inner space shown in FIGS. 10 and 11.

Referring to FIGS. 10 to 12, silicon rubber is injected into the inner space 151 and solidified to form the rubber layer 150. For example, in order to inject the silicon rubber in the inner space 151, an opening (not shown) may be formed, and the silicon rubber may be injected into the opening (not shown) while the inner space 151 maintains a vacuum state.

Then the silicon rubber injected into the inner space 151 is solidified to form the rubber layer 150. For example, the silicon rubber may be heated to form the rubber layer 150.

Figure 13:
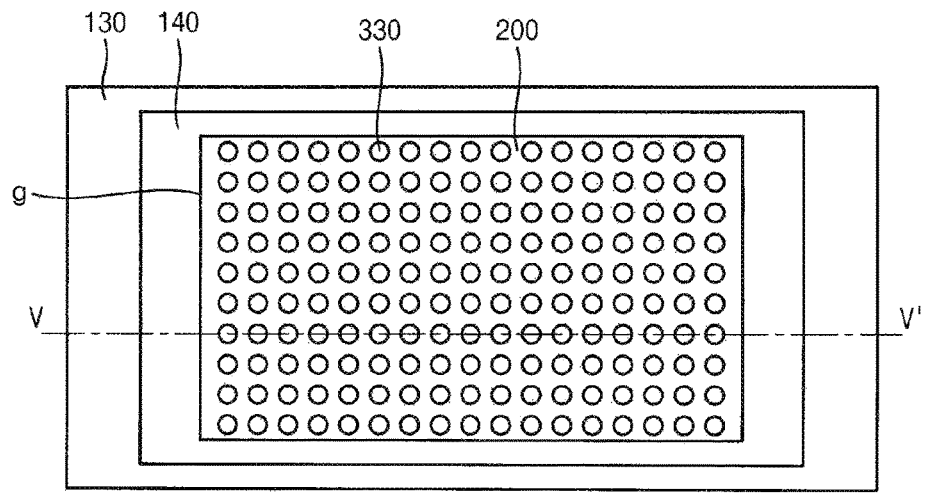
Figure 14:
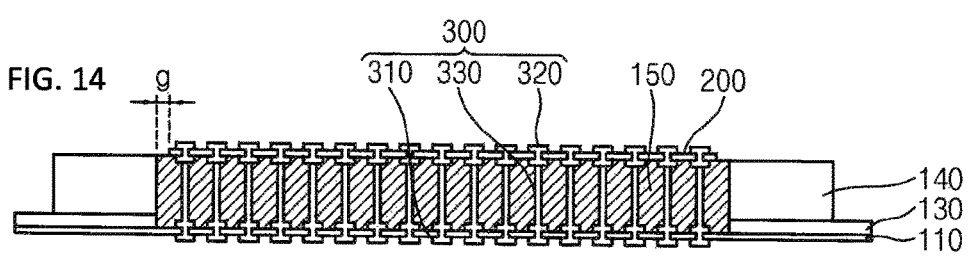

FIG. 13 is a plan view illustrating the upper film formed by removing a portion of the primitive upper film shown in FIG. 12, and FIG. 14 is a cross-sectional view taken along a line V-V' of FIG. 13.

Referring to FIGS. 12 to 14, a portion of the primitive upper film 201 is cut to form the upper film 200. In the present embodiment, a cutting line of the primitive upper film 201 is disposed on the rubber layer 150. That is, the cutting line of the primitive upper film 201 is disposed to form the gap 'g' toward the central area CA (shown in FIG. 2) with respect to an interface portion between the central area CA (shown in FIG. 2) and the peripheral area PA (shown in FIG. 2). The periphery of the upper film 200 is spaced apart from the periphery of the rubber layer 150 by the gap 'g'.

Figure 15:
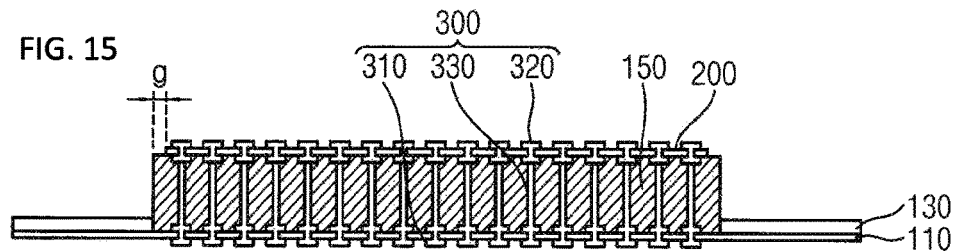

FIG. 15 is a cross-sectional view illustrating removing the mold shown in FIGS. 13 and 14.

Referring to FIGS. 13 to 15, the mold 140 surrounding the rubber layer 150 is then removed. When the mold 140 is removed, the periphery of the rubber 150 is exposed to the outside so that a pressure applied to an upper portion of the rubber layer 150 may be transmitted in sideward.

Figure 16:
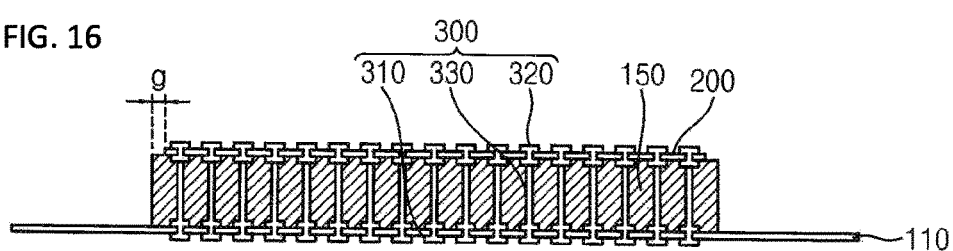

FIG. 16 is a cross-sectional view illustrating removing the supporting plate shown in FIG. 15.

Referring to FIGS. 15 and 16, the supporting plate 130 disposed on the lower film 110 is then removed. When the supporting plate 130 is removed, the upper surface of the lower film 110 is exposed. In another embodiment, the supporting plate 130 may not be removed and the film guide 130 (shown in FIG. 17) may be omitted, and the supporting plate 130 may substitute the film guide 120 (shown in FIG. 17).

Figure 17:
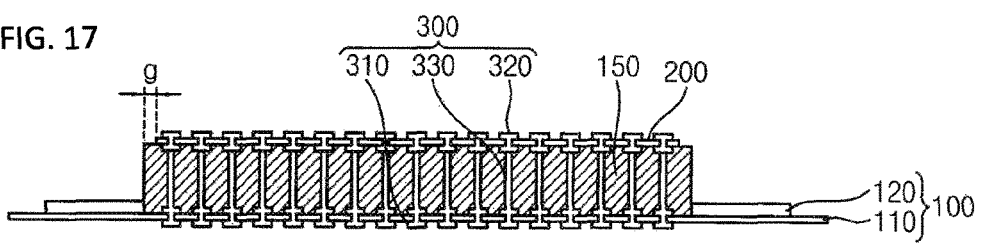

FIG. 17 is a cross-sectional view illustrating the film guide attached on the lower film shown in FIG. 16.

Referring to FIG. 17, the film guide 120 is then attached to the peripheral area PA (shown in FIG. 2) of the lower film 110. In the present embodiment, a center of the film guide 120 is opened, and the rubber layer 150 and the upper film 200 are exposed through the opened center of the film guide 120.

According to the present embodiment, the lower electrode part 310 and the upper electrode part 320 of the electro-connecting member 300 are securely combined with the lower film 110 and the upper film 200, thereby preventing defect in which the lower electrode part 310 or the upper electrode part 320 is buried into the rubber layer 150.

Also, the peripheral area PA corresponding to the periphery of the lower film 110 is extended toward the outer side of the rubber layer 150 and the film guide 120 is combined with the lower film 110 in the peripheral area PA, so that the wired rubber contact may be easily disposed or fixed on the stage 30 (shown in FIG. 3). Furthermore, the film guide 120 is disposed adjacent to the rubber layer 150 to dissipate the external force, thereby preventing concentration of the external force on the interface between the lower film 110 and the rubber layer 150. Thus, separation of the lower film 110 from the rubber layer 150 is prevented.

Also, the gap 'g' is formed between the periphery of the upper film 110 and the periphery of the central area CA of the lower film 110, so that separation of the upper film 200 from the rubber layer 150 by the external force is prevented, and thus, electrical connection of the electro-connecting member 300 is secured.

Figure 18:
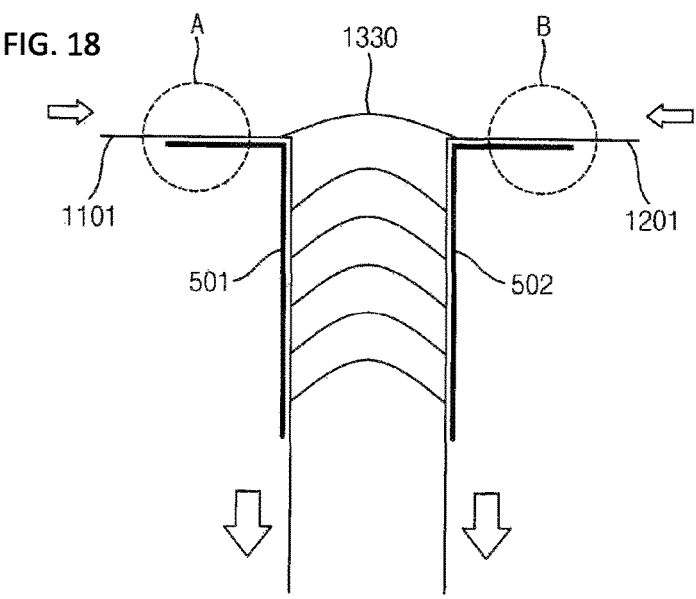
FIG. 18 is a cross-sectional view illustrating a method of manufacturing a wired rubber contact according to one embodiment of the present invention.
Figure 19:
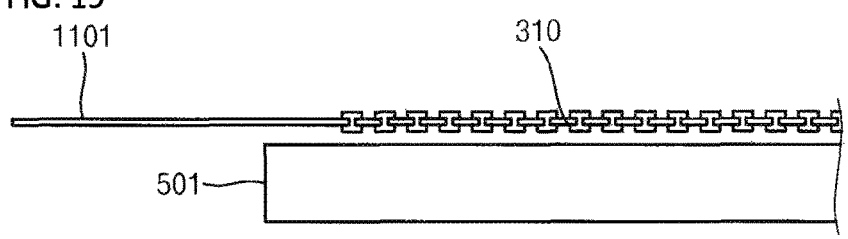
FIGS. 19 and 20 are enlarged cross-sectional views illustrating a portion 'A' and a portion 'B' of FIG. 18.
Figure 20:
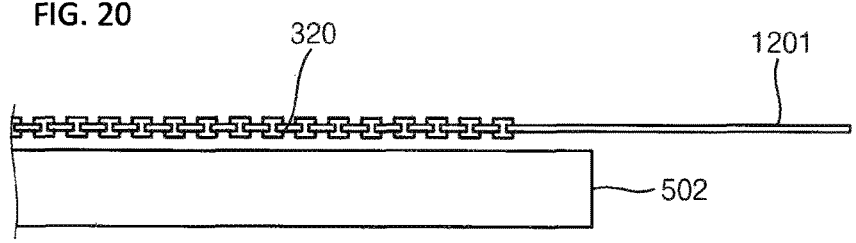

FIG. 18 is a cross-sectional view illustrating a method of manufacturing a wired rubber contact according to one embodiment of the present invention, and FIGS. 19 and 20 are enlarged cross-sectional views illustrating a portion 'A' and a portion 'B' of FIG. 18.

Referring to FIGS. 18 to 20, in order to manufacture the wired rubber contact, firstly, two conveyors 501 and 502 facing each other are disposed. An interval between upper portions of the two conveyors 501 and 502 is greater than an interval between lower portions thereof. In the present embodiment, the upper portions of the conveyors 501 and 502 are disposed in a plane direction, and the lower portions thereof are parallelly disposed in a vertical direction.

A primitive lower film 1101 and a primitive upper film 1201 are transported from the upper portions toward the lower portions of the conveyors 501 and 502. Each of the primitive lower film 1101 and the primitive upper film 1201 includes a plurality of openings, and a lower electrode part 310 and an upper electrode part 320 are disposed in each of the openings. In another embodiment, liquid solder paste may be disposed in each of the openings of each of the primitive lower film 1101 and the primitive upper film 1201 in a screen print method.

A conductive wire 1330 connecting the lower electrode part 310 to the upper electrode part 320 is disposed on a portion in which a distance between the conveyors 501 and 502 is decreased. For example, one end portion of the conductive wire 1330 is inserted into the liquid solder paste of the primitive lower film 1101 and another end of the conductive wire 1330 is inserted into the liquid solder paste of the primitive upper film 1201, and then, heat or laser may be irradiated onto the liquid solder paste. When the heat or the laser is irradiated onto the liquid solder paste, the lower electrode part 310 and the upper electrode part 320 connected through the conductive wire 1330 are formed.

In the present embodiment, a length of the conductive wire 1330 is greater than a distance between the primitive lower film 1101 and the primitive upper film 1201, so that disconnection of the conductive wire 1330 during the manufacturing process is prevented.

The primitive lower film 1101 and the primitive upper film 1201 are transported along the conveyors 501 and 502, so that a plurality of the conductive wires 1330 are connected between the lower electrode part 310 and the upper electrode part 320.

FIGS. 21, 22, 24, 26, 28, 30, and 31 are cross-sectional views illustrating the wired rubber contact shown in FIG. 18, and FIGS. 23, 25, 27, and 29 are plan views illustrating the method of manufacturing the wired rubber contact shown in FIG. 18.

Figure 21:
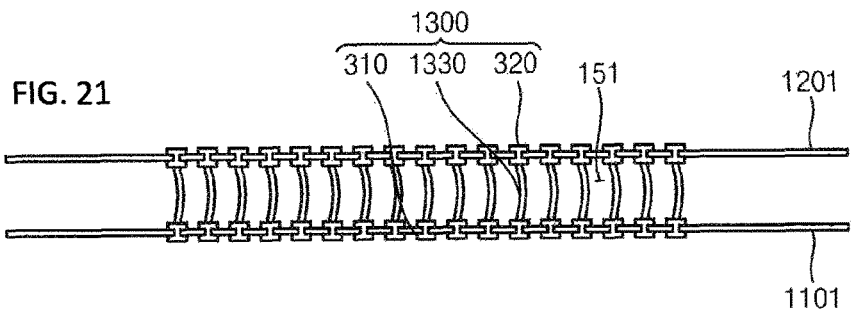
FIGS. 21, 22, 24, 26, 28, 30, and 31 are cross-sectional views illustrating the wired rubber contact shown in FIG. 18.

FIG. 21 is a cross-sectional view illustrating an electro-connecting member manufactured through the process of FIGS. 18 to 20.

Referring to FIG. 21, the electro-connecting member 1300 connects the lower electrode part 310 to the upper electrode part 320. The lower electrode part 310 is disposed to pass through the openings of the primitive lower film 1101, and the upper electrode part 320 is disposed to pass through the primitive upper film 1201. In the present embodiment, the electro-connecting member 1300 is only disposed in a central area of the primitive lower film 1101 and the primitive upper film 1201.

Figure 22:
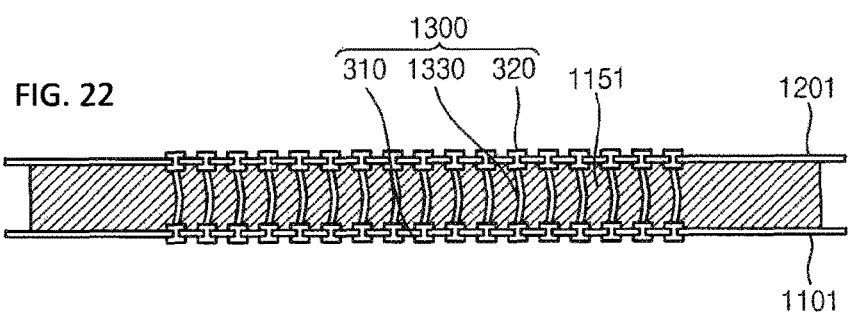

FIG. 22 is a cross-sectional view illustrating silicon rubber filled between the primitive lower film and the primitive upper film shown in FIG. 21.

Referring to FIG. 22, the silicon rubber is filled between the primitive lower film 1101 and the primitive upper film 1201. In the present embodiment, the silicon rubber is disposed in the central area in which the electro-connecting member 1300 is disposed, and is also disposed in the peripheral area in which the electro-connecting member 1300 is not disposed and surrounds the central area. Then, the filled silicon rubber is solidified.

Figure 23:
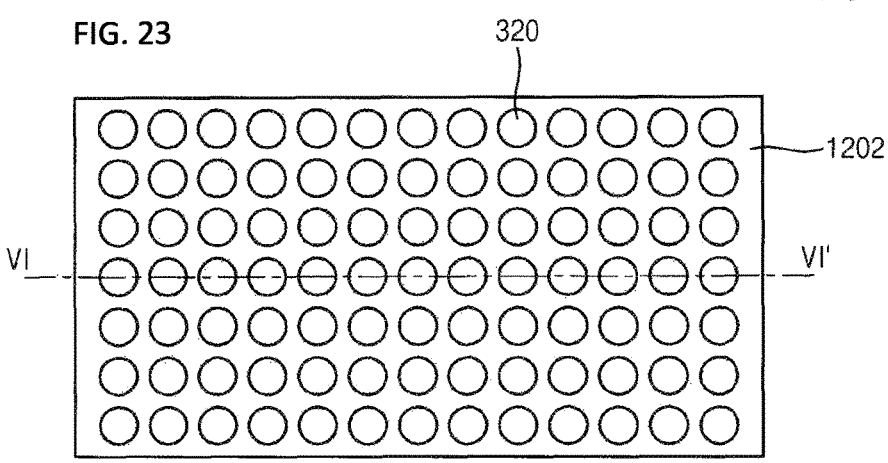
FIGS. 23, 25, 27, and 29 are plan views illustrating the method of manufacturing the wired rubber contact shown in FIG. 18.
Figure 24:
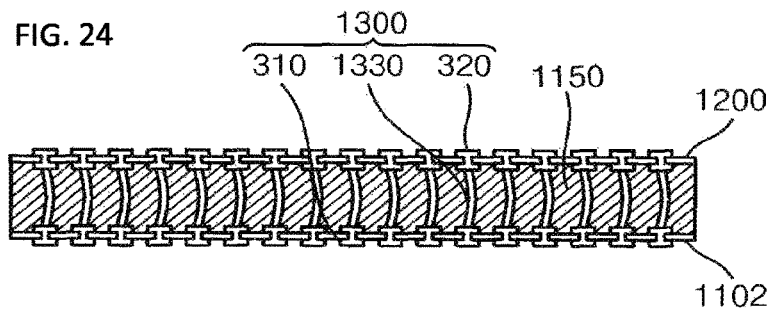

FIG. 23 is a plan view illustrating cutting a portion of the primitive lower film, the primitive upper film, and the solidified silicon rubber shown in FIG. 22 to form the lower film, the upper film, and the rubber layer, and FIG. 24 is a cross-sectional view taken along a line VI-VI' shown in FIG. 23.

Referring to FIGS. 22 to 24, the primitive lower film 1101, the solidified silicon rubber 1151, and the primitive upper film 1201 are cut along an interface between a central area CA in which the electro-connecting member 300 is disposed and a peripheral area PA in which the electro-connecting member 300 is not disposed, so that the lower film 1102, the rubber layer 1150, and the upper film 1200 are formed.

Figure 25:
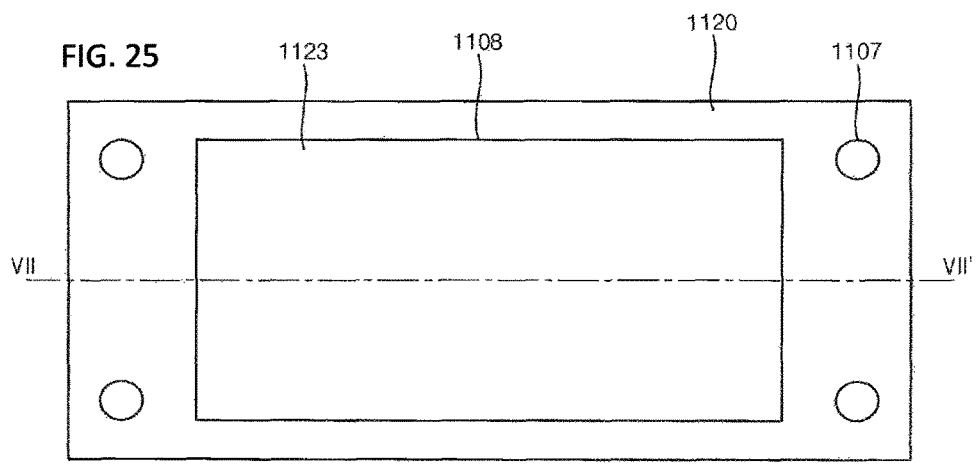
Figure 26:
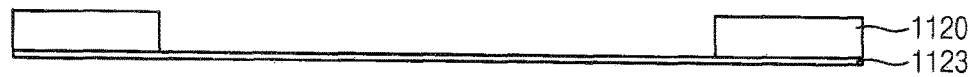

FIG. 25 is a cross-sectional view illustrating a sticky tape attached to a film guide, and FIG. 26 is a cross-sectional view taken along a line VII-VII' of FIG. 25.

Referring to FIGS. 25 and 26, the sticky tape 1123 is attached to a lower surface of a film guide 1120. The film guide 1120 includes a central opening 1108 in which the lower film 1102 and the rubber layer 1150 are received, and a fixing hole 1107 through which the film guide 1120 is fixed to the stage 30 (shown in FIG. 3). The sticky tape 1120 is easily attached and detached, and an upper surface on which sticky material is coated is attached to the lower surface of the film guide 1120.

The central portion of the sticky tape 1123 is exposed through the central opening 1108 of the film guide 1120.

Figure 27:
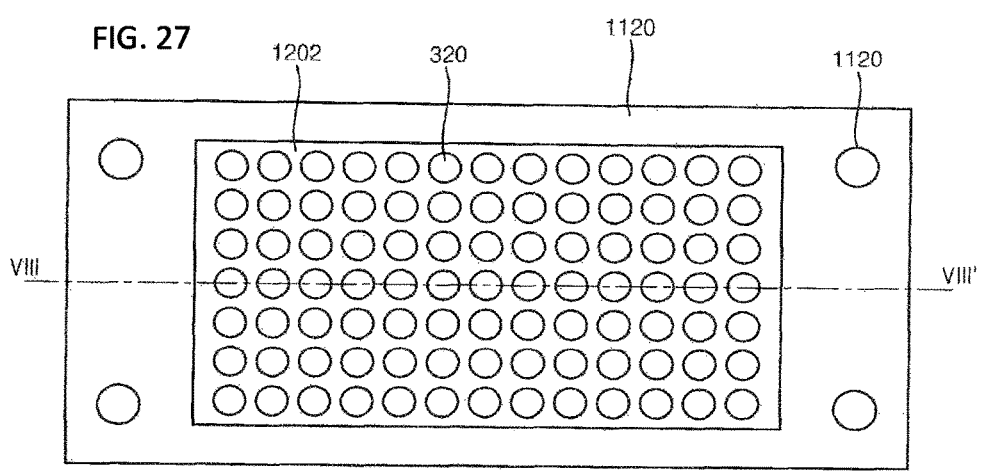
Figure 28:
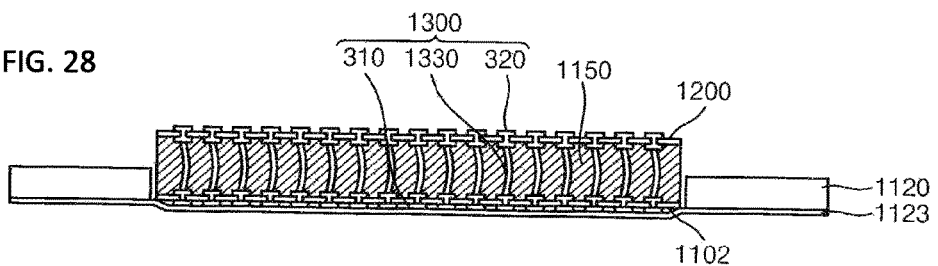

FIG. 27 is a plan view illustrating the lower film shown in FIGS. 23 and 24 attached to the sticky tape shown in FIGS. 25 and 26, and FIG. 28 is a cross-sectional view taken along a line VIII-VIII' of FIG. 27.

Referring to FIGS. 23 to 28, a lower surface of the lower film 1102 is attached to an upper surface of the sticky tape 1123 exposed through the central opening 1108 of the film guide 1120. In the present embodiment, the upper film 1200 is pressed so that the lower surface of the lower film 1102 is attached to the sticky tape 1123, and a lower portion of the lower electrode part 310 is disposed under the lower surface of the film guide 1120. When the lower portion of the lower electrode part 310 is disposed under the lower surface of the film guide 1120, the lower electrode part 310 may easily make contact with an electrode pad 31 (shown in FIG. 3) of a stage 30 (shown in FIG. 3) after the sticky tape 1123 is removed.

Figure 29:
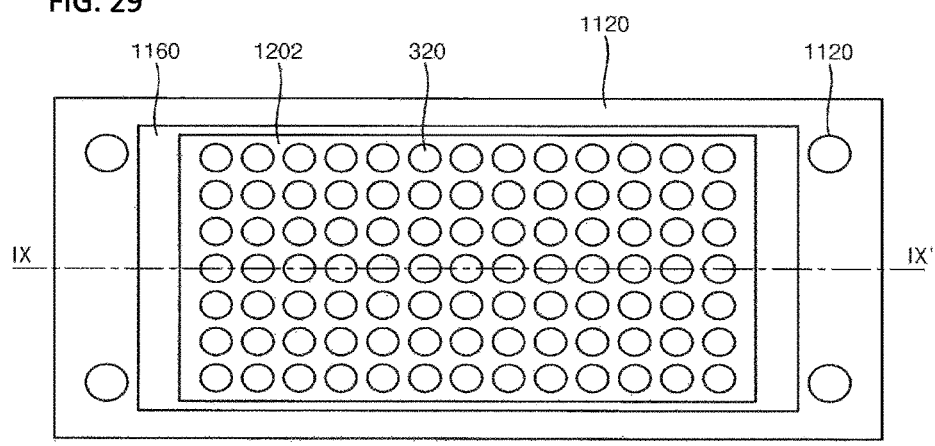

FIG. 29 is a plan view illustrating the rubber layer shown in FIGS. 27 and 28 attached to the film guide, and FIG. 29 is a cross-sectional view taken along a line IX-IX' shown in FIG. 29.

Figure 30:
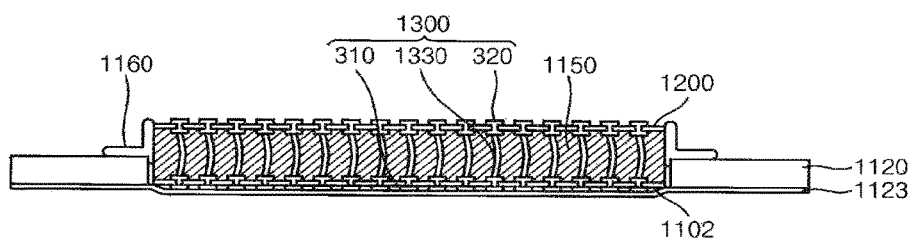

Referring to FIGS. 29 and 30, elastic adhesive is coated along an interface between the rubber layer 1150 and the film guide 1120. For example, the elastic adhesive may include silicon resin. In the present embodiment, when the silicon resin is coated on a side surface of the rubber layer 1150 and a portion of the upper surface of the film guide 1120 adjacent to the rubber layer 1150, the coated silicon resin coats the side surface of the rubber layer 1150 and the portion of the upper surface of the film guide.

Then, the coated silicon resin is solidified to form an adhesive member 1160 which combines the rubber layer 1150 to the film guide 1120. In the present embodiment, the adhesive member 1160 covers the side surface of the upper film 1200 as well as the side surface of the rubber layer 1150, thereby preventing separation of the periphery of the upper film 1200 from the rubber layer 1150. In another embodiment, the upper film 1200 may be combined with the rubber layer 1150 using a combining fixture (not shown) instead of the adhesive member 1160.

Figure 31:
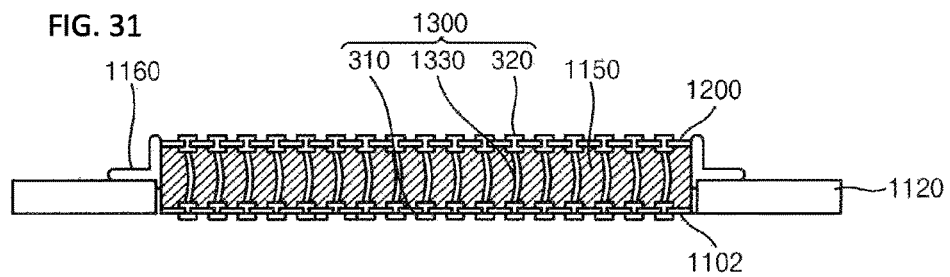

FIG. 31 is a cross-sectional view illustrating removing the sticky tape shown in FIGS. 29 and 30.

Referring to FIGS. 29 to 31, the sticky tape 1123 is then removed from the lower surface of the lower substrate 1102 and the lower surface of the film guide 1120. Thus, the wired rubber contact is completed.

According to the embodiment, the elastic member 1160 and the film guide 1120 cover the side surfaces of the rubber layer 1150, the lower film 1102, and the upper film 1200, so that separation of the lower film 1102 or the upper film 1200 from the rubber layer 1150 by the external impact is prevented.

Also, the adhesive member 1160 has elasticity, so that the external impact is not transmitted to the electro-connecting member 1300.

Furthermore, the conductive wires 1330 may be continuously attached through the conveyors 501 and 502, thereby decreasing manufacturing time.

Also, the length of the conductive wire 1330 is greater than the distance between the primitive lower film 1101 and the primitive upper film 1201 and the distance between the lower film 1102 and the upper film 1200, so that disconnection of the conductive wire 1330 by the external impact during the manufacturing process is prevented.

Figure 32:
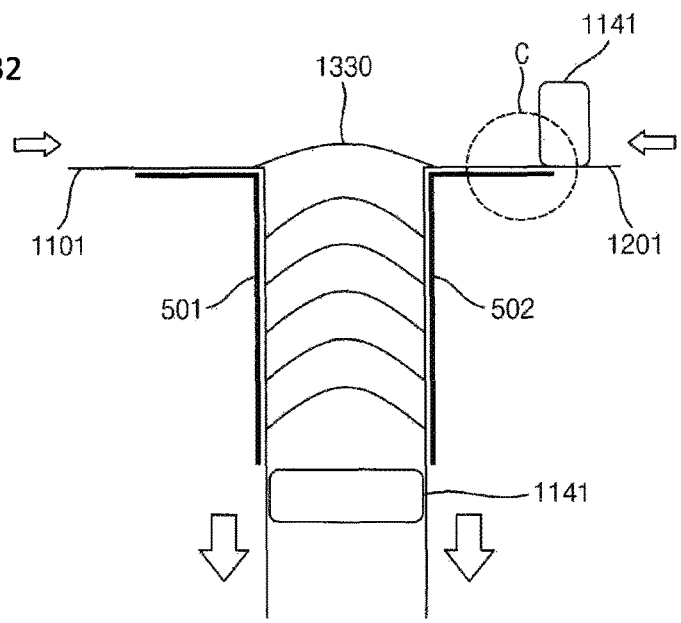
FIG. 32 is a cross-sectional view illustrating a method of manufacturing a wired rubber contact according to one embodiment of the present invention.
Figure 33:
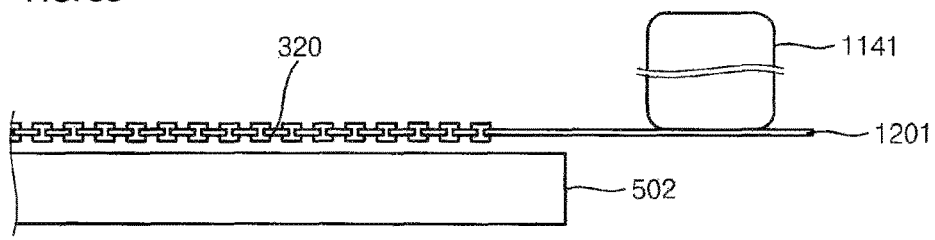
FIG. 33 is an enlarged cross-sectional view illustrating a portion 'C' of FIG. 32.

FIG. 32 is a cross-sectional view illustrating a method of manufacturing a wired rubber contact according to one embodiment of the present invention, and FIG. 33 is an enlarged cross-sectional view illustrating a portion 'C' of FIG. 32. In the present embodiment, the elements except a mold are the same as shown in FIGS. 18 to 31, and thus, any repetitive explanation concerning the above elements will be omitted.

Referring to FIGS. 32 and 33, in order to manufacture the wired rubber contact, firstly, two conveyors 501 and 502 facing each other are disposed.

A primitive lower film 1101 and a primitive upper film 1201 are transported from the upper portions toward the lower portions of the conveyors 501 and 502. A primitive mold 1141 is dropped on the primitive upper film 1201. In the present embodiment, the primitive mold 1141 includes unsolidified synthetic resin, and coated to surround a peripheral portion of the primitive upper film 1201. In another embodiment, the primitive mold 1141 may be dropped on the primitive lower film 1101 or dropped on both of the primitive upper film 1201 and the primitive lower film 1101. For example, the primitive mold may include photoresist.

During the transportation of the primitive lower film 1101 and the primitive upper film 1201, the primitive mold 1141 dropped on the primitive upper film 1201 may be contacted and attached to the primitive lower film 1101.

A conductive wire 1330 connecting the lower electrode part 310 to the upper electrode part 320 is disposed on a portion in which a distance between the conveyors 501 and 502 is decreased.

FIGS. 34 to 37 are cross-sectional views illustrating the method of manufacturing the wired rubber contact shown in FIG. 32.

Figure 34:
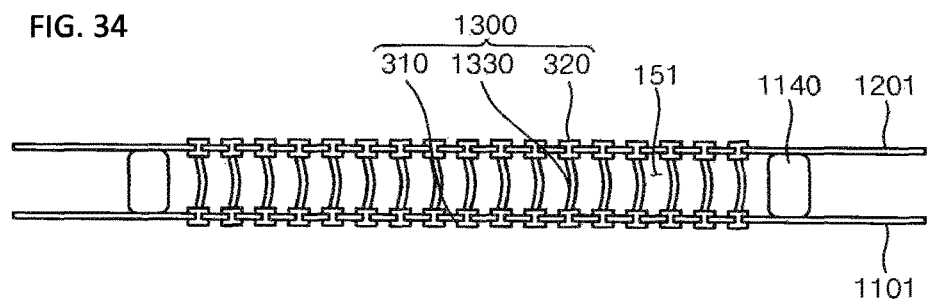
FIGS. 34 to 37 are cross-sectional views illustrating the method of manufacturing the wired rubber contact shown in FIG. 32.

FIG. 34 is a cross-sectional view illustrating an electro-connecting member manufactured through the process of FIGS. 32 and 33.

Referring to FIGS. 32 to 34, the electro-connecting member 1300 connects a lower electrode part 310 and an upper electrode part 320, and is only disposed in a central area of the primary lower film 1101 and the primary upper film 1201. The primitive mold 1141 is disposed in the peripheral area of the primitive lower film 1101 and the primitive upper film 1201 to surround the electro-connecting member 1300.

The primitive mold 1141 is then solidified to form a mold 1140. An inner space 151 is defined by the primitive lower film 1101, the primitive upper film 1201, and the mold 1140.

Figure 35:
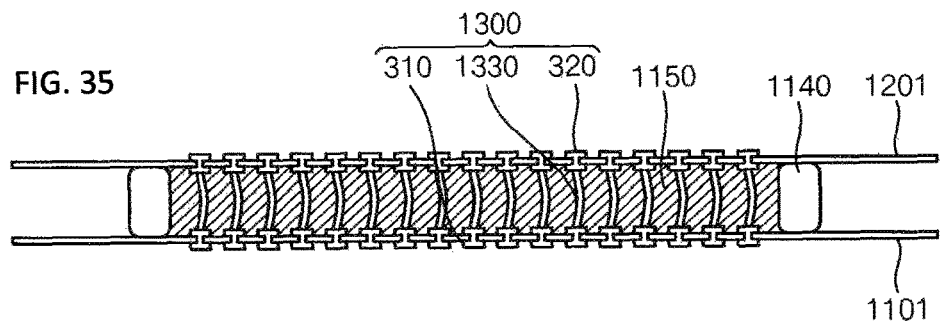

FIG. 35 is a cross-sectional view illustrating a silicon rubber filled in the inner space shown in FIG. 34.

Referring to FIGS. 34 and 35, the silicon rubber is filled in the inner space 151 defined by the primitive lower film 1101, the primitive upper film 1201, and the mold 1140. In the present embodiment, the silicon rubber is only disposed in the central area in which the electro-connecting member 1300 is disposed. The filled silicon rubber is then solidified.

Figure 36:
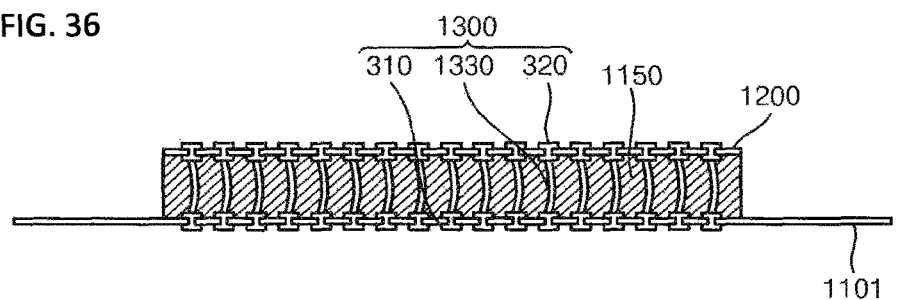

FIG. 36 is a cross-sectional view illustrating cutting a portion of the primitive upper film shown in FIG. 35 and removing a mold.

Referring to FIGS. 35 and 36, the primitive upper film 1101 is cut along an interface between a central area CA in which the electro-connecting member 1300 is disposed and a peripheral area PA in which the electro-connecting member 1300 is not disposed to form the upper film 1200. In the present embodiment, the cutting line of the primitive upper film 1200 is the same as a periphery of the mold 1150. In another embodiment, the cutting line of the primitive upper film 1201 is disposed on an upper surface of the mold 1150 to form a gap 'g' (shown in FIG. 2).

The mold 1140 is then removed to expose an upper surface of the primitive lower film 1101 and a side surface of the rubber layer 1150. For example, the mold 1140 may be removed using solvent such as developing agent, etc.

Figure 37:
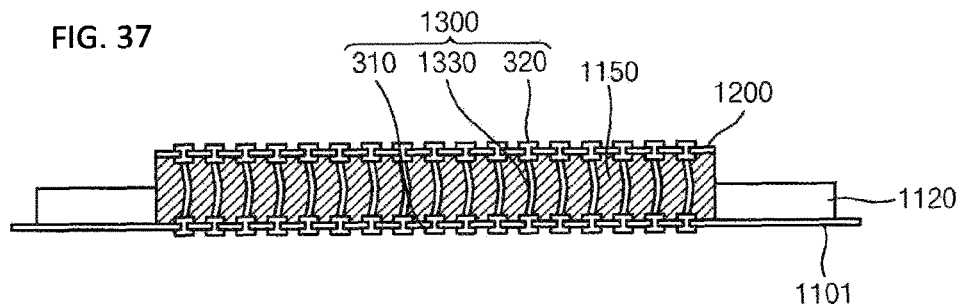

FIG. 37 is a cross-sectional view illustrating a film guide attached to the upper surface of the primitive lower film 1101.

Referring to FIG. 37, the film guide 1120 is attached to the upper surface of the primitive lower film 1101. The upper film 1200, the upper electrode part 320, and the rubber layer 1150 are exposed through the central opening of the film guide 1120.

According to the present embodiment, the conductive wire 1330 and the mold 1140 are interposed between the primitive upper film 1201 and the primitive lower film 1101 through a continuous process, thereby decreasing the manufacturing time.

Also, the rubber layer 1150 is only formed in the inner space 151 formed using the mold 1140, a process of cutting the solidified silicon rubber 1151 (shown in FIG. 22) is omitted, thereby decreasing defect generated during the cutting process.

Figure 38:
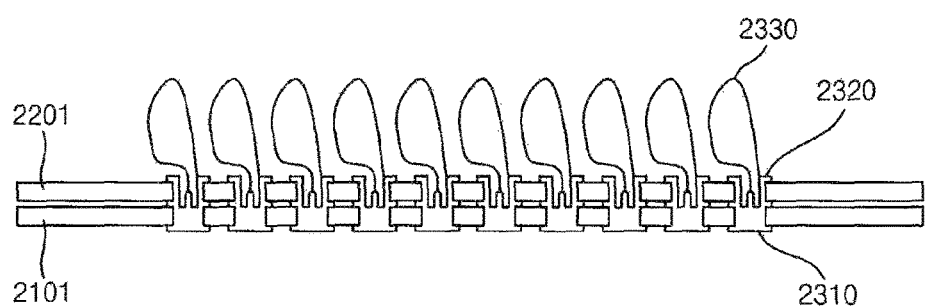
FIGS. 38 and 39 are cross-sectional views illustrating a method of manufacturing a wired rubber contact according to one embodiment of the present invention.
Figure 39:
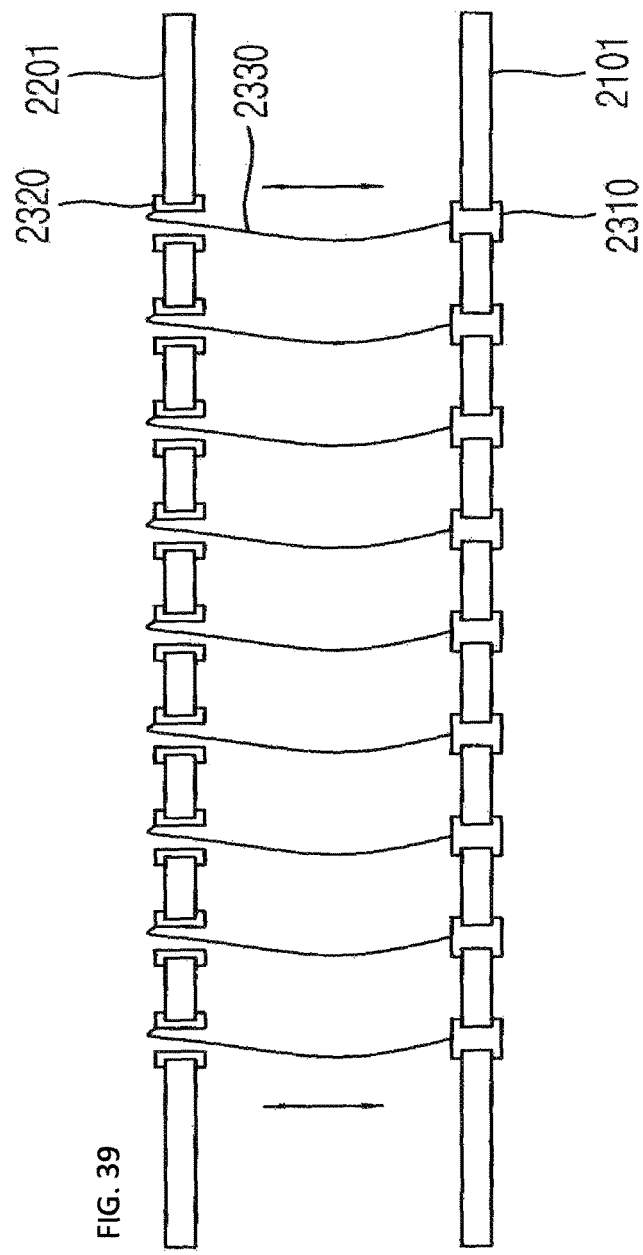

FIGS. 38 and 39 are cross-sectional views illustrating a method of manufacturing a wired rubber contact according to one embodiment of the present invention. In the present embodiment, the elements except an electro-connecting member are the same as shown in FIGS. 1 to 37, and thus, any repetitive explanation concerning the above elements will be omitted.

Referring to FIG. 38, a primitive lower film 2101 and a primitive upper film 2202 through which a plurality of openings are formed in a central area are prepared.

A lower electrode part 2310 which fills each of the openings of the primitive lower film 2101 is then formed, and an upper electrode part 2320 is formed adjacent to each of the openings of the primitive upper film 2201. In the present embodiment, the lower electrode part 2310 fills each of the openings of the primitive lower film 2101, but the upper electrode part 2320 does not fill each of the openings of the primitive upper film 2201 and maintains a throughhole at a center thereof. That is, the upper electrode part 2320 is formed along a periphery of each of the openings of the primitive upper film 2201.

The primitive upper film 2201 and the primitive lower film 2101 are then arranged so that the lower electrode part 2310 is exposed through the throughhole of the upper electrode part 2320.

A conductive wire 2330 is combined with the lower electrode part 2310 and the upper electrode 2320. In the present embodiment, one end portion of the conductive wire 2330 is connected to the upper surface of the lower electrode part 2310 and another end portion of the conductive wire 2330 is connected to the upper surface or an inner surface of the upper electrode part 2320. For example, the conductive wire 2330 may be bonded to the lower electrode part 2310 and the upper electrode part 2320 through soldering.

A distance between the primitive upper film 2201 and the primitive lower film 2101 is then separated so that the conductive wire 2330 is disposed between the primitive upper film 2201 and the primitive lower film 2101. Here, soldering process of filling the throughhole of the upper electrode part 2320 may be added.

Silicon rubber, etc., is then filled and solidified between the primitive upper film 2201 and the primitive lower film 2101.

The primitive upper film 2201 and/or the solidified silicon rubber (not shown) is then cut to form an upper film (not shown) and a rubber layer (not shown).

A film guide (not shown) is then disposed along a side surface of the rubber layer (not shown).

According to the present embodiment, the upper electrode part 2320 and the lower electrode part 2310 have different structures from each other, so that a plurality of the conductive wires 2330 may be simultaneously combined with the upper electrode part 2320 and the lower electrode part 2310.

The above embodiments disclose a structure including the rubber layer. In another embodiment, the rubber layer may be omitted, and the wired rubber contact may be realized using elasticity of the conductive wire itself.

In the above embodiments, the words of the primitive upper film and the primitive lower film may be substituted by the upper film and the lower film, respectively.

According to the embodiments of the present invention, the lower electrode part and the upper electrode part of the electro-connecting member are securely combined with the lower film and the upper film, thereby preventing the defect in which the lower electrode part or the upper electrode part is buried into the rubber layer.

Also, the peripheral area corresponding to the periphery of the lower film is extended toward the outer side of the rubber layer and the film guide is combined with the lower film in the peripheral area, so that the wired rubber contact may be easily disposed or fixed on the stage. Furthermore, the film guide is disposed adjacent to the rubber layer to dissipate the external force, thereby preventing concentration of the external force on the interface between the lower film and the rubber layer. Thus, the separation of the lower film from the rubber layer is prevented.

Also, the gap is formed between the periphery of the upper film and the periphery of the central area of the lower film, so that the separation of the upper film from the rubber layer by the external force is prevented, and thus, the electrical connection of the electro-connecting member is secured.

Furthermore, the upper film and the lower film cover upper and the lower surfaces of the rubber layer to protect the rubber layer and the electro-connecting member from external pollutants such as dust, moisture, etc.

Also, the upper film is pressed so that the lower surface of the lower film is attached to the sticky tape, and the lower portion of the lower electrode part is disposed under the lower surface of the film guide. When the lower portion of the lower electrode part is disposed under the lower surface of the film guide, the lower electrode part may easily make contact with the electrode pad of the stage after the sticky tape is removed.

Furthermore, the elastic member and the film guide cover the side surfaces of the rubber layer, the lower film, and the upper film, so that separation of the lower film or the upper film from the rubber layer by the external impact is prevented.

Also, the adhesive member has elasticity, so that the external impact is not transmitted to the electro-connecting member.

Furthermore, the conductive wires may be continuously attached through the conveyor, thereby decreasing manufacturing time.

Also, the length of the conductive wire is greater than the distance between the primitive lower film and the primitive upper film and the distance between the lower film and the upper film, so that the disconnection of the conductive wire by the external impact during the manufacturing process is prevented.

Furthermore, the conductive wire and the mold are interposed between the primitive upper film and the primitive lower film through the continuous process, thereby decreasing the manufacturing time.

Also, the rubber layer is only formed in the inner space formed using the mold, the process of cutting the solidified silicon rubber is omitted, thereby decreasing defect generated during the cutting process.

Furthermore, the upper electrode part and the lower electrode part have different structures from each other, and simultaneously, the conductive wires may be coupled to the upper electrode part and the lower electrode part.

Therefore, the lifetime is increased, and reliability is improved.

INDUSTRIAL APPLICABILITY

The present invention has the industrial applicability in a test apparatus of a connecting member between a semiconductor device, circuit parts, etc. In the present embodiment, the wired rubber contact connecting the semiconductor chip and the stage for inspection is disclosed, but those skilled in the art will understand that the inventive concept of the present invention can be applied to any field in which a conventional anisotropic conductive film is used.

As described above, although preferable embodiments of the present invention have been described, those skilled in the art will readily appreciate that many modifications are possible in the example embodiments without materially departing from the novel teachings and advantages of the present inventive concept.

The invention claimed is:
1. A wired rubber contact comprising:
a lower film having a central area in which a plurality of openings are formed and a peripheral area surrounding the central area, and including a plurality of lower electrode parts formed in the openings;
an upper film including a plurality of openings and a plurality of upper electrode parts formed in the openings, a periphery of the upper film being disposed within an interface between the central area and the peripheral area;
a plurality of conductive wires disposed between the lower film and the upper film, the conductive wires connecting between the lower electrode parts and the upper electrode parts;
a rubber layer including elastic material and disposed in the central area of the lower film, a periphery of the rubber layer being protruded toward an outer side from the periphery of the upper film, and the rubber layer burying the conductive wires and maintaining a constant distance between the lower film and the upper film; and
a film guide disposed in the peripheral area of the lower film along a side surface of the rubber layer and integrally formed with the lower film, the film guide having a thickness greater than the lower film,
wherein the lower film is attached to a lower surface of the rubber layer, and the upper film is attached to an upper surface of the rubber layer,
wherein the wired rubber contact is interposed between a semiconductor chip and a stage,
wherein the semiconductor chip is disposed on the upper film, and electrode pads of the semiconductor chip make contact with the upper electrode parts exposed on the upper film, and wherein the stage is disposed under the lower film, and the lower electrode parts exposed under the lower film make contact with electrode pads of the stage.

2. The wired rubber contact of claim 1, wherein the upper film and the lower film are integrally formed with the rubber layer.

3. A wired rubber contact comprising:
a lower film including a plurality of openings and a plurality of lower electrode parts formed in the openings;
an upper film including a plurality of openings and a plurality of upper electrode parts formed in the openings and facing the lower electrode parts;
a plurality of conductive wires disposed between the lower film and the upper film and connecting between the lower electrode parts and the upper electrode parts, a length of the conductive wires being greater than an interval between the lower film and the upper film;
a rubber layer including elastic material and disposed between the lower film and the upper film to bury the conductive wires, the rubber layer maintaining a constant distance between the lower film and the upper film;
a film guide disposed to surround side surfaces of the rubber layer and the lower film, the film guide having a thickness greater than the lower film; and
a combining member including elastic adhesive and attached to a side surface of the rubber layer and an upper surface of the film guide to combine the rubber layer with the film guide,
wherein the lower film is attached to a lower surface of the rubber layer, and the upper film is attached to an upper surface of the rubber layer,
wherein the wired rubber contact is interposed between a semiconductor chip and a stage,
wherein the semiconductor chip is disposed on the upper film, and electrode pads of the semiconductor chip make contact with the upper electrode parts exposed on the upper film, and
wherein the stage is disposed under the lower film, and the lower electrode parts exposed under the lower film make contact with electrode pads of the stage.

4. The wired rubber contact of claim 3, wherein the combining member comprises an adhesive member or a combining fixture.

* * * * *